United States Patent [19]

Sakakibara et al.

[11] Patent Number: 4,982,225
[45] Date of Patent: Jan. 1, 1991

[54] IMAGE FORMING APPARATUS FOR CONTROLLING THE HUMIDITY AND OPERATING PARAMETERS ASSOCIATED WITH AN IMAGE FORMING PROCESS

[75] Inventors: Kenji Sakakibara, Ichinomiya; Yuji Asano, Nagoya, both of Japan

[73] Assignee: Brother Kogyo Kabushiki Kaisha, Nagoya, Japan

[21] Appl. No.: 471,800

[22] Filed: Jan. 29, 1990

[30] Foreign Application Priority Data

Jan. 30, 1989 [JP] Japan ................................. 1-20504

[51] Int. Cl.$^5$ .................... G03G 15/12; G03G 15/01
[52] U.S. Cl. ........................... 355/30; 355/35; 355/71; 355/208; 355/327
[58] Field of Search .............. 355/30, 32, 35, 64, 355/65, 67, 71, 208, 228, 327

[56] References Cited

U.S. PATENT DOCUMENTS

| | | |
|---|---|---|
| 4,193,680 | 3/1980 | Yoshikawa et al. |
| 4,367,036 | 1/1983 | Sakamaki et al. ............... 355/208 |
| 4,502,777 | 3/1985 | Okamoto et al. ............... 355/208 |
| 4,585,319 | 4/1986 | Okamoto et al. |
| 4,618,242 | 10/1986 | Yamagishi ............... 355/282 |
| 4,727,385 | 2/1988 | Nishikawa et al. |
| 4,860,058 | 8/1989 | Kobayashi et al. ............... 355/27 |
| 4,888,618 | 12/1989 | Ishikawa ............... 355/214 X |

Primary Examiner—R. L. Moses
Attorney, Agent, or Firm—Oliff & Berridge

[57] ABSTRACT

An image forming apparatus including an image forming device for forming an image on a photosensitive recording medium is disclosed. The image forming device forms the image in accordance with at least one operating parameter. A humidity detecting sensor detects an ambient humidity in the apparatus. A heater changes a relative humidity in the apparatus. A controller controls the heater in accordance with the sensed humidity and optimizes the at least one operating parameter at a temperature changed by the heater.

30 Claims, 3 Drawing Sheets

IMAGE FORMING APPARATUS FOR CONTROLLING THE HUMIDITY AND OPERATING PARAMETERS ASSOCIATED WITH AN IMAGE FORMING PROCESS

BACKGROUND OF THE INVENTION

1. Field of the Invention

The present invention relates to an image forming apparatus for forming an image on a photosensitive recording medium and, more particularly, to an image forming apparatus capable of forming an image of high quality even in a highly humid atmosphere.

2. Description of Related Art

A conventional image forming apparatus using a photosensitive recording medium, such as a photosensitive pressure-sensitive recording paper, exposes the photosensitive recording medium to light in an atmosphere having a fixed temperature because the sensitivity of the photosensitive recording medium is dependent on temperature. The exposed photosensitive recording medium is then subjected to a pressure-fixing process for a heat-fixing process. It is possible for the photosensitive layer to fall off in the pressure-fixing process under a highly humid condition.

A photosensitive pressure-sensitive recording paper can include, for example, numerous light-setting microcapsules containing a dye which reacts with a developer to develope color, bound to a base paper with a water-soluble binder. When this photosensitive pressure-sensitive recording paper is irradiated by light reflected from an original to form a latent image, the microcapsules exposed to light harden and the unexposed microcapsules remain unhardened. The photosensitive pressure-sensitive paper carrying the latent image and a developing paper are superposed and a high pressure is then applied to both sides of the superposed photosensitive pressure-sensitive recording paper and the developing paper to crush the unhardened microcapsules. Consequently, the dye and the developer interact to develop an image on the developing paper.

The binding effect of the binder will be reduced when the binder absorbs moisture from a highly humid atmosphere and a photosensitive layer consisting of the binder and the microcapsules is liable to separate from the base paper. Consequently, portions of the binder and microcapsules are undesirably transferred to the developing paper which deteriorates the quality of the image formed on the developing paper. Such a problem may be solved by additionally providing the image forming apparatus with a dehumidifier or the like to reduce the absolute humidity within the image forming apparatus, however, this requires an increase in the size of the image forming apparatus.

In U.S. patent application Ser. No. 167,198 (filed Mar. 11, 1988) assigned to the same assignee of the present application, there has been proposed a method of reducing the relative humidity within the image forming apparatus by raising the temperature of the photosensitive medium or that of the ambient atmosphere. However, since the sensitivity of the photosensitive medium is dependent on temperature, raising the temperature may change the photosensitive characteristics of the photosensitive medium and deteriorate the quality of the image.

SUMMARY OF THE INVENTION

Accordingly, it is an object of the present invention to provide an image forming apparatus capable of forming an image of a satisfactory quality without causing the separation of a photosensitive layer from a base paper even under a highly humid condition.

According to the present invention, there is provided an image forming apparatus comprising: image forming means for forming an image on a photosensitive recording medium, said image forming means forming the image in accordance with at least one operating parameter; humidity detecting means for detecting an ambient humidity in said apparatus and outputting a detection signal; heating means for changing a relative humidity in said apparatus by heating; and control means for controlling said heating means in accordance with said detection signal, and making said parameter an optimum one at a temperature changed by said heating means.

BRIEF DESCRIPTION OF THE DRAWINGS

The above and other objects, features and advantages of the present invention will become more apparent from reading the following description of the preferred embodiment taken in connection with the accompanying drawings, in which.

DETAILED DESCRIPTION OF THE PREFERRED EMBODIMENT

Figure 1:
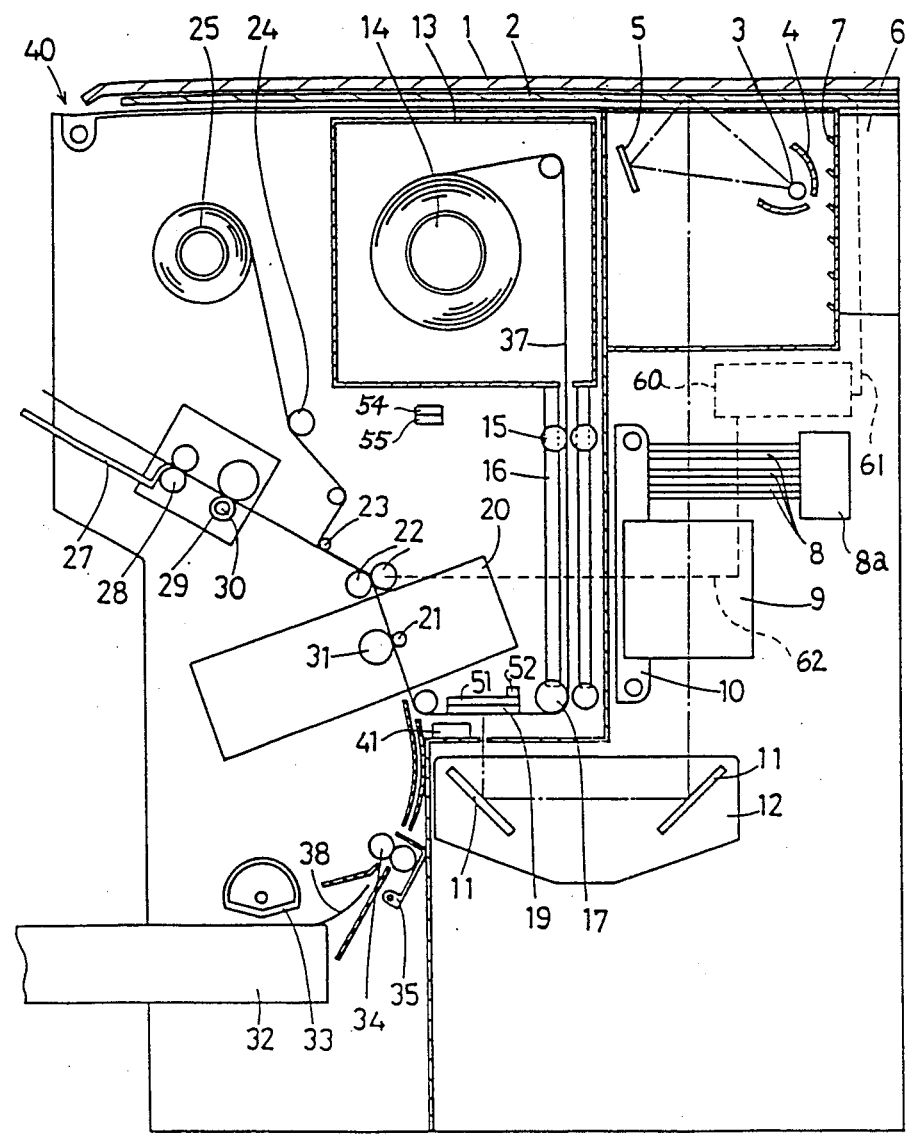
FIG. 1 is a sectional view of a preferred embodiment of an image forming apparatus according to the present invention.

FIG. 1 is a schematic sectional view of a photosensitive pressure-sensitive copying machine capable of producing full color copies. A photosensitive recording medium comprising a microcapsule paper and a developing paper for use on such a photosensitive pressure-sensitive copying machine is disclosed in Japanese Patent Laid-Open No. 88739/1983, and hence the description thereof will be omitted.

Referring to FIG. 1, a photosensitive pressure-sensitive copying machine 40 has a top unit comprising a contact glass 2 capable of traversing in a horizontal plane, and an original cover 1 for covering an original placed on the contact glass 2 with its surface carrying an image in contact with the contact glass 2. A light source is disposed on the upper right-hand corner of the copying machine 40. The light source comprises a halogen lamp 3 extended along a direction perpendicular to the direction of traverse motion of the contact glass 2, a semicylindrical reflector 4 extending along the length of the halogen lamp 3, and a reflector 5 disposed on the left side, as viewed in FIG. 1, of the halogen lamp 3. The light source emits a flat beam of light toward the contact glass 2. Thus, the entire surface of the contact glass 2 from one end to the other is irradiated continuously by the flat beam of light emitted by the halogen lamp 3 during a lateral scanning stroke of the contact glass 2. The flat light beam emitted by the light source and transmitted through the contact glass 2 is reflected by an original (not shown) placed on the contact glass 2. The document cover 1 covers the contact glass plate 2 to prevent the emission of light through portions of the contact glass 2 not covered with the original.

Reflector 5 directs light traveling in directions other than a direction toward the document toward the document for the efficient utilization of the light emitted by the halogen lamp 3. A fan 6 disposed on the right side, as viewed in FIG. 1, of the halogen lamp 3 ventilates the light source through a louver 7 to reduce the temperature around the halogen lamp 3 and sucks the ambient air through the gap between the contact glass 2 and the halogen lamp 3 to cool the contact glass 2.

The light emitted by the halogen lamp 3 and reflected by the original placed on the contact glass 2 travels through filters 8 and a lens 9. Characteristics of the reflected light are adjusted by the filters 8 according to the sensitivity characteristics of a microcapsule paper 37 to adjust the color tone of a copied image. Each of the filters 8 cuts only light of one of the three primary colors. The filters 8 can individually be moved by a known filter driving device 8a in horizontal directions, as viewed in FIG. 1. The accompanying ratios of the filters 8 in the optical path of the reflected light are varied to regulate the color tone of the light transmitted through the filters 8. Lens 9 is mounted on a lens mount 10 so that the tilt of the optical axis of the lens 9 with respect to the optical path can be adjusted within a minute angular range. The direction of travel of the light condensed by the lens 9 is changed through an angle of 180° by two reflecting mirrors 11, and the light is focused on the microcapsule paper 37 in close contact with the lower surface of an exposure table 19. The two reflecting mirrors 11 are fixed to a support plate 12. The length of the optical path and the focus point are adjusted through the fine adjustment of the position of the support plate 12.

The continuous microcapsule paper 37 is wound in a roll on a shaft 14 of a removable cassette 13 disposed under the contact glass 2. The microcapsule paper 37 is advanced by rollers through a pressure developing unit 20 and is taken up on the winding shaft 25.

The microcapsule paper 37 drawn out from the cassette 13 through an opening formed in the cassette 13 is delivered by a feed roller 15 and a guide drum 17 via the exposure table 19 to the pressure developing unit 20. After passing the pressure developing unit 20, the microcapsule paper 37 is conveyed via a separating roller 23 and an aligning roller 24 and is taken up on the winding shaft 25. After being drawn out from the cassette 13, the microcapsule paper 37 is shielded from light by a shielding plate 16. The microcapsule paper 37 is advanced by a feed roller 22 at a constant speed coinciding with the moving speed of the contact glass 2, so that the latent images of successive portions of the document are formed sequentially on the microcapsule paper 37 as the same advances across the exposure table 19.

A developing sheet cassette 32 containing developing sheets 38 is disposed below the pressure developing unit 20. A sector roller 33 takes the developing sheets 38 out of cassette 32 one at a time. The developing sheet 38 is registered by developing sheet feed rollers 34 and a register gate 35, and then the developing sheet 38 is delivered to the sheet inlet of the pressure developing unit 20. Thus, the developing sheet 38 is joined to the microcapsule paper 37 with its surface coated with a developing agent in close contact with the surface of the microcapsule paper 37 coated with microcapsules. The combination of the microcapsule paper 37 and the developing sheet 38 is then fed to the pressure developing unit 20. The pressure developing unit 20 comprises a pressure roller 21 and a backup roller 31 having a diameter greater than that of the pressure roller 21. The combination of the microcapsule paper 37 and the developing sheet 38 is compressed between the pressure roller 21 and the backup roller 31 to crush microcapsules which have not been exposed to light, so that an image is formed on the developing sheet 38.

After being delivered from the pressure developing unit 20, the microcapsule paper 37 is separated from the developing sheet 38 by the separating roller 23. The microcapsule paper 37 is advanced upward and the developing sheet 38 is advanced toward a heat-fixing unit in a direction perpendicular to that of advancement of the microcapsule paper 37. The heat-fixing unit promotes the coloring of the image to produce a clear image, and then delivers the developing sheet 38 to a delivery tray 27 with the surface of the developing sheet 38 carrying the image facing up. The heat-fixing unit comprises a hollow heat roller 29 internally provided with a heater 30, and a delivery roller 28. The microcapsule paper 37 separated from the developing sheet 38 advances via the aligning roller 24 and is taken up on the winding shaft 25.

The sensitivity of the microcapsule paper 37 is dependent on temperature. Accordingly, the temperature of the microcapsule paper 37 is controlled. A heating plate 51 for controlling the temperature of the microcapsule paper 37 and a first temperature sensor 52 for detecting the temperature of the heating plate 51 are disposed on top of the exposure table 19.

Figure 2:
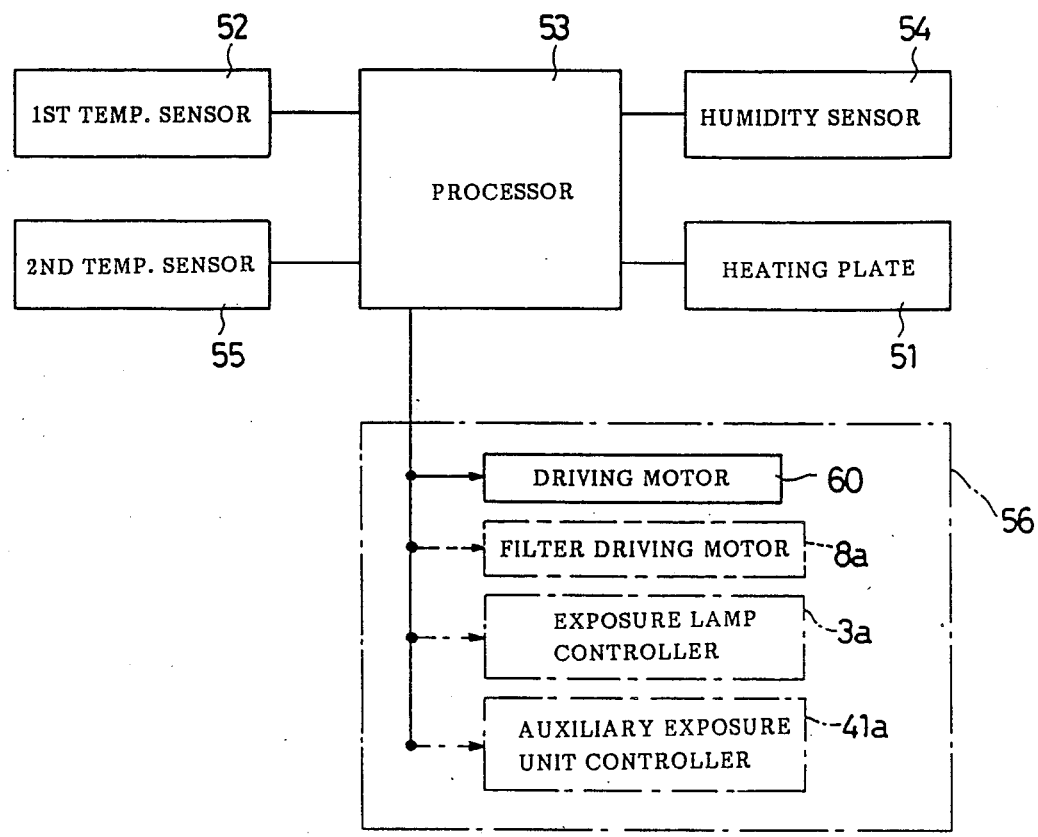
FIG. 2 is a block diagram of the electrical configuration of the image forming apparatus of FIG. 1.

As shown in FIG. 2, the heating plate 51, the first temperature sensor 52, a humidity sensor 54 and a second temperature sensor 55 respectively for detecting the humidity and temperature in the vicinity of the cassette 13, and functional components 56 of the copying machine 40 including a driving motor 60 are connected to a processor 53. The functional components 56 connected to the processor 53 are the driving motor 60, an exposure lamp controller 3a, the filter driving motor 8a and an auxiliary exposure unit controller 41a. The top unit which includes contact glass 2 has a rack provided in parallel with a moving direction thereof. As schematically shown in FIG. 1, the driving motor 60 is connected to the rack via a well-known power train 61 and to the feed roller 22 via another well-known power train 62.

The operation of the copying machine 40 thus constructed will be described hereinafter based on an assumption that the sensitivity characteristics of the microcapsule paper 37 used on the copying machine 40 embodying the present invention are optimum at 25° C. and deteriorate gradually with temperature deviation from 25° C., and that the undesirable peeling of the photosensitive layer occurs when humidity in the vicinity of the cassette 13 exceeds 80%.

Figure 3:
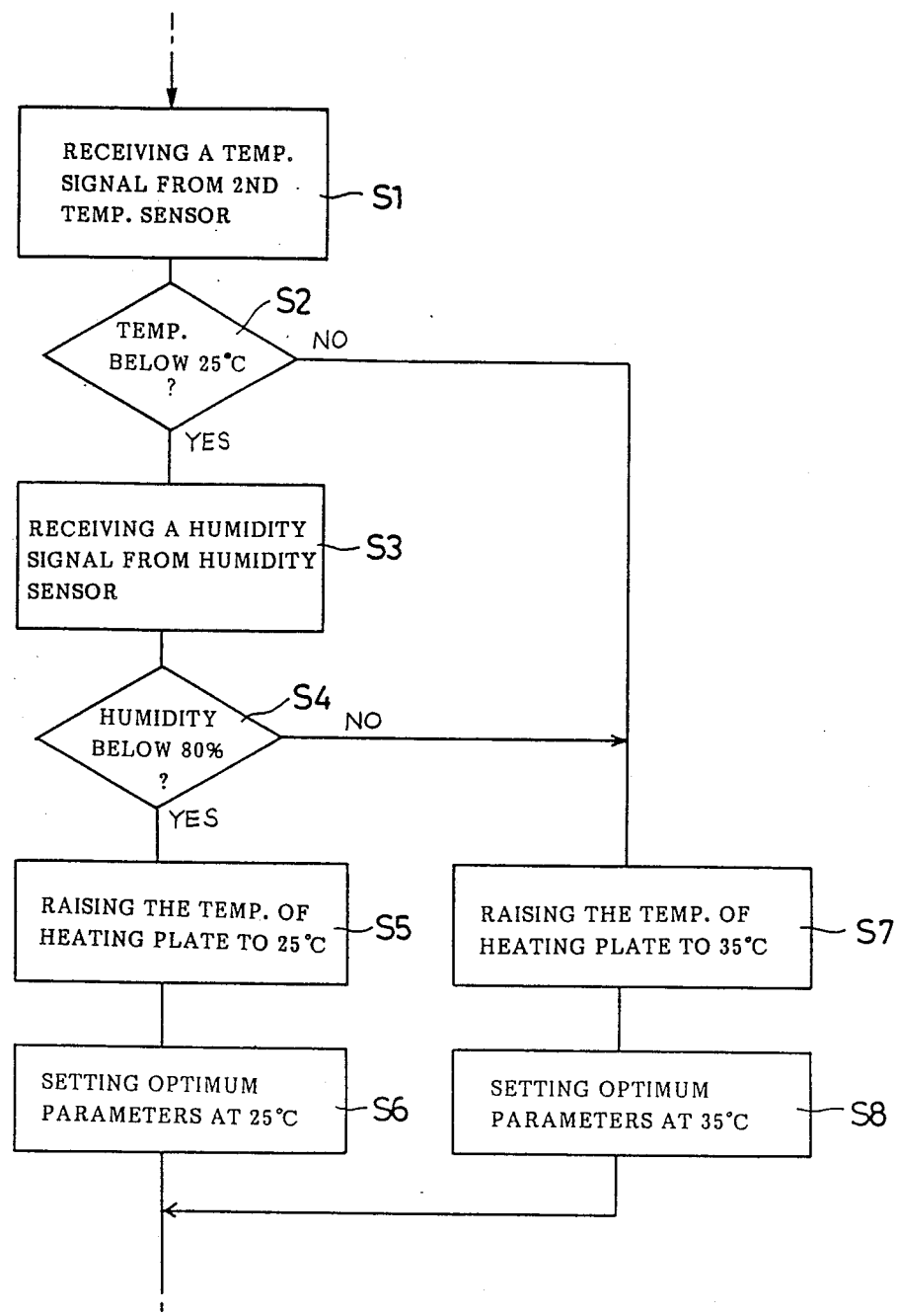
FIG. 3 is a flow chart explaining the operation of the image forming apparatus of FIG. 1.

Cover 1 is opened, an original is placed on the contact glass 2, the cover is closed, and then a start button, not shown, is actuated. Prior to the copying operation, the processor 53 executes a program shown in FIG. 3. In step S1, the processor 53 receives a temperature signal representing the temperature in the vicinity of the cassette 13 from the second temperature sensor 55. in step S2, a query is made to see if the temperature is 25° C. or below. When the response in step S2 is affirmative, the processor 53 receives a humidity signal representing the humidity in the vicinity of the cassette 13 from the humidity sensor 54 in step S3. In step S4, a query is made to see if the humidity is 80% or below. When the response in step S4 is affirmative, the heating plate 51 is energized in step S5 to raise the temperature of the heating plate 51° to 25° C., which is an optimum temperature for the microcapsule paper 37. The power to be supplied to the heating plate 51 is determined on the basis of the difference between a desired temperature, i.e., 25° C., and the actual temperature of the heating plate 51 received from the first temperature sensor 52. In step S6, the processor 53 sets optimum exposure parameters including exposure speed for the microcapsule paper 37 at 25° C. In this embodiment, an exposure speed appropriate to the microcapsule paper 37 at 25° C. is a standard exposure speed. When the response in step S2 is negative, namely, when the temperature in the vicinity of the cartridge 13 is higher than 25° C., or when the response in step S4 is negative, namely, when the humidity in the vicinity of the cartridge 13 is higher than 80%, the heating plate 51 is energized in step S7 to heat the heating plate 51 to 35° C. In step S8, the processor 53 sets optimum exposure parameters for the microcapsule paper 37 at 35° C. Since peeling of the photosensitive layer is possible when the humidity exceeds 80%, heating plate 51 is heated to 35° C. to decrease the relative humidity in order to prevent the peeling of the photosensitive layer. However, increase in the temperature of the heating plate 51 results in the deterioration of the sensitivity of the microcapsule paper 37. Accordingly, the exposure speed as one of the exposure parameters is reset to an exposure speed lower than the standard exposure speed to secure satisfactory quality of the image by extending exposure time. The copying machine 40 embodying the present invention operates according to the exposure parameters for a state in which the heating plate 51 is heated to 25° C. or the exposure parameters for a state in which the heating plate 51 is heated to 35° C. Since the copying machine 40 is not provided with any positive cooling means, the heating plate 51 is heated to 35° C. when the response in step S2 is negative, namely, when the temperature in the vicinity of the cartridge 13 is higher than 25° C.

After the completion of the foregoing program, the following copying process is started. First, the contact glass 2 is moved to the right, as viewed in FIG. 1, and is stopped upon the arrival of the contact glass 2 at a position where the left end of the contact glass 2 is opposite the light source, the halogen lamp 3 is lighted, and the contact glass 2 then starts moving to the left. Light emitted by the halogen lamp 3 and reflected by the document travels through the filters 8 and the lens 9, is reflected by the reflecting mirrors 11, and is focused on the microcapsule paper 37 advancing along the lower surface of the exposure table 19 to form a latent image of the document on the microcapsule paper 37. The processor 53 controls the operating speed of the driving motor 60 and the microcapsule paper 37 advances along the lower surface of the exposure table 19 at a speed equal to the moving speed of the contact glass 2. The moving speed of the contact glass 2, that is the operating speed of the driving motor 60, is determined according to the exposure parameters determined in step S6 or S8.

The sector roller 33 is rotated in synchronism with the leftward movement of the contact glass 2 to take out the developing sheet 38 from the developing sheet cassette 32. The developing sheet 38 is placed on the mirocapsule paper 37 and the combination of the microcapsule paper 37 and the developing sheet 38 is fed to the pressure developing unit 20, by which the latent image formed on the microcapsule paper 37 is developed and transferred to the developing sheet 38. The image formed on the developing sheet 38 is fixed to the developing sheet 38 by the heat-fixing unit, and then the developing sheet 38 is delivered to the delivery tray 27. After leaving the pressure developing unit 20, the microcapsule paper 37 is separated from the developing sheet 38 and is wound continuously around the winding shaft 25. Upon the arrival of the contact glass 2 at a position where the right end of the contact glass 2 is opposite the light source, the copying cycle is completed and the halogen lamp 3 is turned off.

An auxiliary exposure unit 41 is disposed below the pressure developing unit and near the exposure table 19 so as to emit light upward. The light source of the auxiliary exposure unit 41 and the halogen lamp 3, i.e., a main light source, are turned on and off synchronously. The light source of the auxiliary exposure unit 41 emits white light carrying no image information. The white light adjusts the gradation of the latent image, hence the gradation of the image formed on the developing sheet 38.

In the foregoing description, the exposure speed, i.e., one of the exposure parameters, was changed according to the temperature of the heating plate 51, however, the luminance of the halogen lamp 3 may be changed instead of the exposure speed. For example, when the temperature of the heating plate 51 is raised to decrease the relative humidity, the luminance of the halogen lamp 3 is increased accordingly to compensate for the deterioration of the sensitivity of the microcapsule paper 37 at the higher temperature.

The occupying ratios of the filters 8 in the optical path also are exposure parameters. If the change of the temperature of the heating plate 51 causes the change of the color tone of the image formed on the developing sheet 38, the occupying ratios of the filters 8 in the optical path may be adjusted so that the image has an optimum color tone.

Furthermore, the intensity of the white light emitted by the light source of the auxiliary exposure unit also is an exposure parameter. If the gradation of the image formed on the developing sheet 38 is changed by the change of the temperature of the heating plate 51, the intensity of the white light may be adjusted so that the image has an optimum gradation.

Furthermore, a plurality of the foregoing parameters may be adjusted simultaneously to form an image having a further improved quality.

Although the heating plate 51 is set at one of the two set temperatures in this embodiment, the temperature of the heating plate 51 may be selected from more than two set temperatures. The photosensitive pressure-sensitive copying machine of the present invention may be provided with any suitable heating means. Naturally, the photosensitive copying machine of the present invention may additionally be provided with cooling means.

What is claimed is:

1. An image forming apparatus comprising:
    image forming means for forming an image on a photosensitive recording medium, said image forming means forming the image in accordance with at least one operating parameter;
    humidity detecting means for detecting an ambient humidity in said apparatus and outputting a detection signal;

temperature changing means for changing a relative humidity in said apparatus by changing a temperature; and control means for controlling said temperature changing means in accordance with said detection signal, and for adjusting said at least one operating parameter based on a temperature change by said temperature changing means.

2. An image forming apparatus according to claim 1, wherein said temperature changing means is a heating means for changing said relative humidity by heating.

3. An image forming apparatus according to claim 1, wherein said image forming means includes an exposure unit having a light source to form said image on said photosensitive recording medium.

4. An image forming apparatus according to claim 3, wherein said at least one parameter includes exposure time and said control means changes said exposure time of said exposure unit.

5. An image forming apparatus according to claim 3, wherein said image forming means includes advancing means for advancing said photosensitive recording medium, said image being formed on said photosensitive recording medium while being advanced by said advancing means, and wherein said at least one parameter includes an advancing speed of said advancing means and said control means changes said advancing speed of said advancing means.

6. An image forming apparatus according to claim 3, wherein said at least one parameter includes an amount of light emitted from said light source and said control means changes said amount of light emitted from said light source.

7. An image forming apparatus according to claim 3, wherein said image forming means includes a filter unit for adjusting characteristics of a light exposed on said photosensitive recording medium, and wherein said at least one parameter includes a degree of adjustment of said filter unit and said control means changes said degree of adjustment of said filter unit.

8. An image forming apparatus according to claim 7, wherein said filter unit includes plural filters disposed in a light path from said light source to said photosensitive recording medium and filter driving means for controlling an insertion amount of each of said filters in said light path, and wherein said degree of adjustment is said insertion amount and said control means changes said insertion amount.

9. An image forming apparatus according to claim 3, wherein said image forming means includes an auxiliary exposure unit for adjusting a gradation of said image formed on said photosensitive recording medium, and wherein said at least one parameter includes a degree of adjustment of said auxiliary exposure unit and said control means controls said degree of adjustment of said auxiliary exposure unit.

10. An image forming apparatus according to claim 1, wherein said heating means is provided near a path of said photosensitive recording medium.

11. An image forming apparatus according to claim 1, wherein said recording medium includes a microcapsule sheet.

12. An image forming apparatus comprising:

image forming means for forming an image on a photosensitive recording medium, said image forming means forming the image in accordance with at least one operating parameter;

humidity detecting means for detecting an ambient humidity in said apparatus and outputting a detection signal;

temperature detecting means for detecting an ambient temperature in said apparatus and outputting a temperature signal;

heating means for changing a relative humidity in said apparatus by heating; and control means for controlling said heating means based upon said detection signal and said temperature signal, said control means also adjusting said at least one operating parameter based on a temperature changed by said heating means.

13. An image forming apparatus according to claim 12, wherein said image forming means includes an exposure unit having a light source to form said image on said photosensitive recording medium.

14. An image forming apparatus according to claim 13, wherein said at least one parameter includes exposure time and said control means changes said exposure time of said exposure unit.

15. An image forming apparatus according to claim 13, wherein said image forming means includes advancing means for advancing said photosensitive recording medium, said image being formed on said photosensitive recording medium while being advanced by said advancing means, and wherein said at least one parameter includes an advancing speed of said advancing means and said control means changes said advancing speed of said advancing means.

16. An image forming apparatus according to claim 13, wherein said at least one parameter includes an amount of light emitted from said light source and said control means changes said amount of light emitted from said light source.

17. An image forming apparatus according to claim 13, wherein said image forming means includes a filter unit for adjusting characteristics of a light exposed on said photosensitive recording medium, and wherein said at least one parameter includes a degree of adjustment of said filter unit and said control means changes said degree of adjustment of said filter unit.

18. An image forming apparatus according to claim 17, wherein said filter unit includes plural filters disposed in a light path from said light source to said photosensitive recording medium and filter driving means for controlling an insertion amount of each of said filters in said light path, and wherein said degree of adjustment is said insertion amount and said control means changes said insertion amount.

19. An image forming apparatus according to claim 13, wherein said image forming means includes an auxiliary exposure unit for adjusting a gradation of said image formed on said photosensitive recording medium, and wherein said at least one parameter includes a degree of adjustment of said auxiliary exposure unit and said control means controls said degree of adjustment of said auxiliary exposure unit.

20. An image forming apparatus according to claim 12, wherein said heating means is provided near a path of said photosensitive recording medium.

21. An image forming apparatus according to claim 12, wherein said recording medium includes a microcapsule sheet.

22. An image forming apparatus comprising:

image forming means for forming an image on a photosensitive recording medium, said image forming means forming the image in accordance with at least one operating parameter, said image forming means including an exposure table for exposing said photosensitive recording medium to a light image to form a latent image thereon;

humidity detecting means for detecting an ambient humidity in said apparatus and outputting a detection signal;

heating means for changing a relative humidity in said apparatus by heating said exposure table; and control means for controlling said heating means based on said detection signal, and for adjusting said at least one operating parameter based on a temperature of said exposure table changed by said heating means.

23. An image forming apparatus according to claim 22, wherein said image forming means includes an exposure unit having a light source to form said latent image on said photosensitive recording medium.

24. An image forming apparatus according to claim 23, wherein said at least one parameter includes exposure time and said control means changes said exposure time of said exposure unit.

25. An image forming apparatus according to claim 23, wherein said image forming means includes advancing means for advancing said photosensitive recording medium, said image being formed on said photosensitive recording medium while being advanced by said advancing means, and wherein said at least one parameter includes an advancing speed of said advancing means and said control means changes said advancing speed of said advancing means.

26. An image forming apparatus according to claim 23, wherein said at least one parameter includes an amount of light emitted from said light source and said control means changes said amount of light emitted from said light source.

27. An image forming apparatus according to claim 23, wherein said image forming means includes a filter unit for adjusting characteristics of a light exposed on said photosensitive recording medium, and wherein said at least one parameter includes a degree of adjustment of said filter unit and said control means changes said degree of adjustment of said filter unit.

28. An image forming apparatus according to claim 27, wherein said filter unit includes plural filters disposed in a light path from said light source to said photosensitive recording medium and filter driving means for controlling an insertion amount of each of said filters in said light path, and wherein said degree of adjustment in said insertion amount and said control means changes said insertion amount.

29. An image forming apparatus according to claim 23, wherein said image forming means includes an auxiliary exposure unit for adjusting a gradation of said image formed on said photosensitive recording medium, and wherein said at least one parameter includes a degree of adjustment of said auxiliary exposure unit and said control means controls said degree of adjustment of said auxiliary exposure unit.

30. An image forming apparatus according to claim 22, wherein said recording medium includes a microcapsule sheet.

* * * * *